United States Patent [19]

Thurston

[11] Patent Number: 5,027,120
[45] Date of Patent: Jun. 25, 1991

[54] DELTA-SIGMA CONVERTER WITH BANDPASS FILTER FOR NOISE REDUCTION IN RECEIVERS

[75] Inventor: Andrew M. Thurston, Springfield, United Kingdom

[73] Assignee: GEC-Marconi Limited, Middlesex, United Kingdom

[21] Appl. No.: 528,977

[22] Filed: May 25, 1990

[30] Foreign Application Priority Data

May 26, 1989 [GB] United Kingdom ............... 8912137
Apr. 24, 1990 [GB] United Kingdom ............... 9009197

[51] Int. Cl.⁵ .............................................. H03M 3/00
[52] U.S. Cl. ........................................ 341/143; 375/27
[58] Field of Search .................... 341/143; 375/27, 28, 375/29, 33, 34

[56] References Cited

U.S. PATENT DOCUMENTS 3,723,909  3/1973  Condon ........................... 341/143 X
4,467,291  8/1984  Roza ................................ 341/143 X
4,528,551  7/1985  Agrawal et al. .................... 341/143
4,772,871  9/1988  Suzuki et al. ................... 341/143 X
4,857,928  8/1989  Gailus ............................. 341/143
4,958,158  9/1990  Hashizume et al. ............... 341/143

FOREIGN PATENT DOCUMENTS 2188517  9/1987  United Kingdom .

Primary Examiner—Howard L. Williams
Attorney, Agent, or Firm—Spencer & Frank

[57] ABSTRACT

Analogue signals are converted to digital data by use of a Sigma-Delta modulator including a pair of bandpass filters and a feedback loop including a digital to analogue converter. The tendency of such a circuit to instability is reduced or eliminated by making small variations in the phase of a clock controlling feedback pulses relative to a clock controlling data output pulses. As an alternative, corrections may be made to the feedback pulses by an additional feedback loop providing pulses for correcting the feedback pulses.

26 Claims, 6 Drawing Sheets

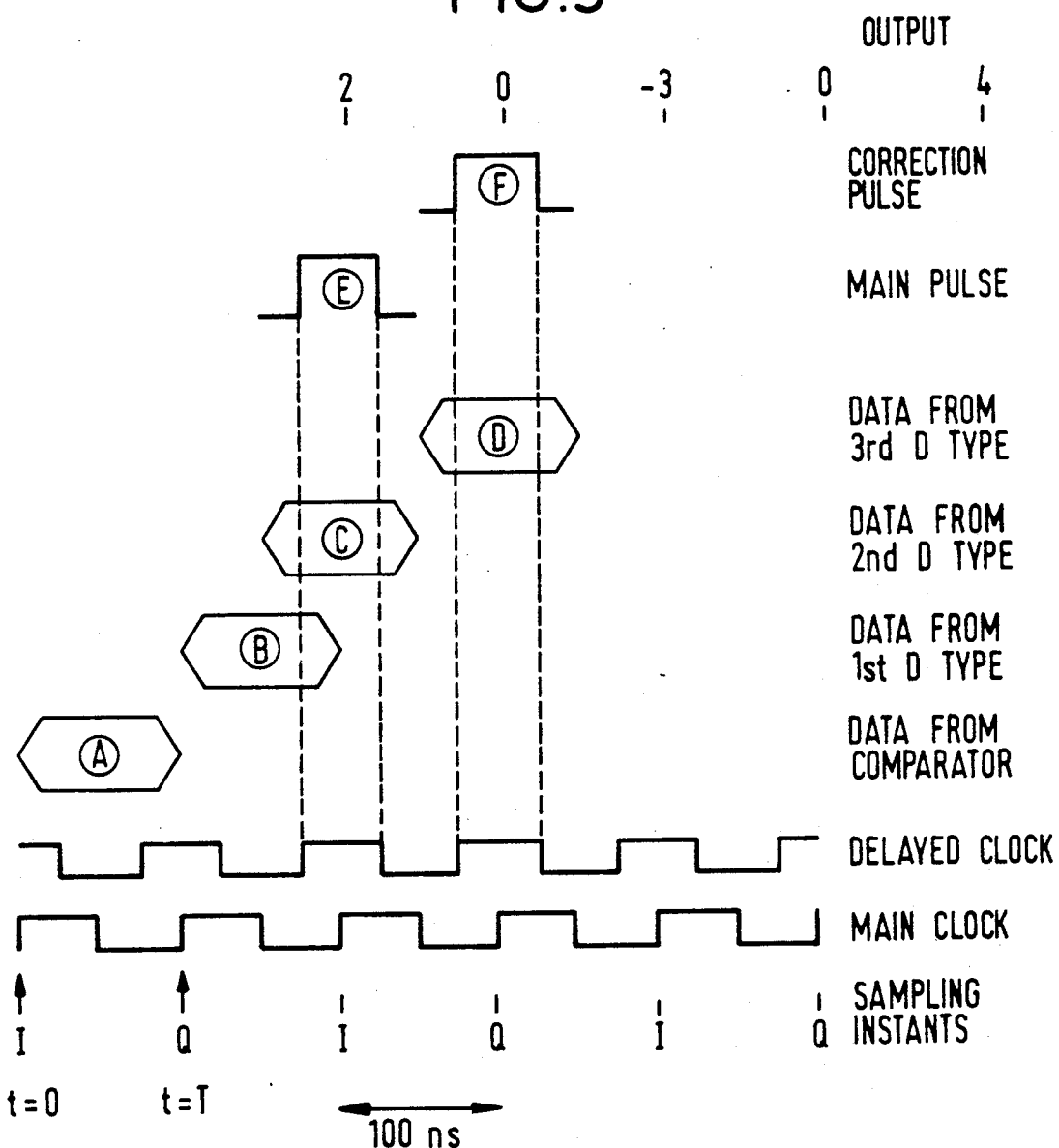

DELTA-SIGMA CONVERTER WITH BANDPASS FILTER FOR NOISE REDUCTION IN RECEIVERS

This invention relates to analogue-to-digital converters.

BACKGROUND OF THE INVENTION

Field of the Invention

The invention is particularly but not exclusively concerned with digital implementation of some of the stages of a radio receiver, and an aim is to achieve a highly linear, high resolution output.

It is desirable to have the analogue-to-digital converter as near the front end of the receiver as possible to obtain the benefits of subsequent digital processing but as a practical matter often the earliest this can be done is at a suitable intermediate frequency (i.f.) stage. For example, this could be a frequency of 2.5 MHz with a bandwidth of 100 kHz.

SUMMARY OF THE INVENTION

The inventors have proposed to use a Sigma-Delta noise shaping analogue-to-digital converter (FIG. 1) for this purpose. The converter includes a bandpass analogue filter H(s) which feeds a quantiser Q for converting the analogue signal X (s) to one of a discrete number of levels which are sampled by a sampler. A digital-to-analogue converter is included in a feedback loop to an adder in which the analogue output strives to follow the input signal to the coder within the passband of the filter. Y(z) is the digital output.

The converter has a null in the quantisation noise at one quarter of the sampling frequency $f_s$ (FIG. 2). Also, the quantiser could be a single bit quantiser, i.e. a positive level or a negative level, since this is inherently linear in operation: if a quantiser with more than one bit was used, any deviation from nominal (linearly related) values would cause non-linearity in its operation.

The inventor considered implementing the above noise shaping circuit in sampled data form involving a sampling of the input signal before processing in the noise shaping circuit. Firstly, a digital noise shaping circuit was considered i.e. digital filter, quantiser and adder, and omitting the digital-to-analogue converter from the feedback path. However, while the advantages of a null in the quantisation noise and linearity are maintained, the i.f. signal must be sampled and digitised to be fed to the noise shaping coder, and the necessary analogue-to-digital converter would be multi-bit and therefore potentially non-linear. Secondly, an analogue sampled data circuit was considered utilising a sampled data analogue filter, quantiser, digital-to-analogue converter and analogue adder. While this reduced the size and power consumption of the converter and avoided the need for a multi-bit A-D converter, as in the digital implementation, distortions could still arise from the jitter on the input sample and hold circuit and distortions in the sampled data filter.

For this reason, the inventor decided to implement the coder in the analogue form described, which avoids sampling the signal until the point of the quantiser/analogue to digital converter. However, i.f. signals can be described in terms of I(in phase) and Q(quadrature) components, and it was discovered that cross-talk was inherent in the system in that it did not modulate the internal (i.f.) I and Q components entirely independently of each other, resulting in undesirable phase changes in the converted i.f. signal. In the closed loop system described, this can result in degraded signal to noise performance and possible instability.

The underlying reason for this problem was appreciated by the inventor and will now be described with reference to FIG. 2a, which shows an ideal open-loop impulse response for the band pass filter. If the circuit was notionally broken before the quantiser Q and sampler, the fedback pulse corresponding to an output data pulse at the output of the quantiser and sampler should produce the signal shown in FIG. 2a at the input of the quantiser and sampler. However, it was discovered that, inherent in the system, at least when implemented as a two-stage filter, was the feature that the zero crossings of the impulse response did not occur in practice at the sampling instants T. Instead, they were displaced to one side or other of the sampling instants.

If the zero crossings appeared to the right of the sampling instants as seen in FIG. 2a, the impulse response would be finite at odd sampling instants T, 3T, 5T etc, and would be alternatively positive and negative. If even sampling instants corresponded to an I component and odd sampling instants corresponded to a Q component, the fedback pulse corresponding to an I data output pulse, would superimpose an alternating signal on Q data output pulses. The tendency to have a natural resonant frequency could thus result in instability.

The invention provides an analogue-to-digital converter comprising bandpass filter means for filtering a signal derived from an analogue input signal, digitising means for producing samples at one of a discrete number of values corresponding to a signal derived from the output of the bandpass filter means, a feedback loop for feeding a signal derived from the output of the digitising means to the bandpass filter means, the circuit being arranged to produce in operation a minimum in the quantisation noise in the passband of the filter means, and in which at least some of the zero crossings of the response of the band pass filter means to a single fedback pulse are made to coincide with the sampling instants.

Making at least some of the zero crossings coincide with the sampling instants eliminates the problem referred to. Thus, in the case of I and Q components appearing at alternate sampling instants, these would be modulated independently of each other provided all zero crossings coincided with the sampling instants. If a signal consisted of one component at each alternate sampling instant, and another only at every third or fifth intermediate sampling instant, only those zero crossings would need to coincide with the sampling instants.

In order to make at least some of the zero crossings coincide with the sampling instants, means may be provided to produce a phase offset between the feedback pulses and the sampling instants of the digitising means. Referring to FIG. 2a, in the case of the zero crossings not coinciding with the sampling instants, the zero crossings could be made to coincide by displacing the response curve relative to the grid of sampling instants, or vice versa. Of course, in this case, the desired samples between the zero crossing samples would not lie exactly at the respective peaks of the impulse response. However, a small error here in a sampling instant would make only a very small error in the error amplitude since the peaks have only a small slope at these regions.

As an alternative, a corrective feedback loop may be provided for feeding correction pulses derived from the output of the digitising means to the bandpass filter means. The zero crossings are made to coincide with the sampling instants by cancellation of the non-zero component at the sampling instants by the correction pulses.

Indeed, with some combinations of i.f. and sampling frequency, desired results in terms of preserving stability and generating a good noise shape may be obtained if the open loop response of the bandpass filter means was such that the zero crossings did not coincide with the sampling instants. The component values of the bandpass filter means could be such that the open loop response at the sampling instants coincided with the values which would be obtained with a suitable digital filter, and it is possible that the open loop response would be non-zero at all sampling instants (while following the ideal digital response at the sampling instants). The phase offset relationship or corrective feedback loop could be employed to produce such a result.

The bandpass filter means may be in two stages, each stage of which may comprise an inductor, capacitor, and resistor which may be fed with current and produce an output voltage signal.

The digitising means may produce samples at one of two values, and could include a comparator arranged to produce a positive or negative voltage output.

BRIEF DESCRIPTION OF THE DRAWINGS

Analogue-to-digital converters constructed in accordance with the invention will now be described by way of example with reference to the accompanying drawings, in which:

FIG. 9 is a timing diagram for the circuit of FIG. 8.

DETAILED DESCRIPTION OF THE PREFERRED EMBODIMENT(S)

Figure 3:
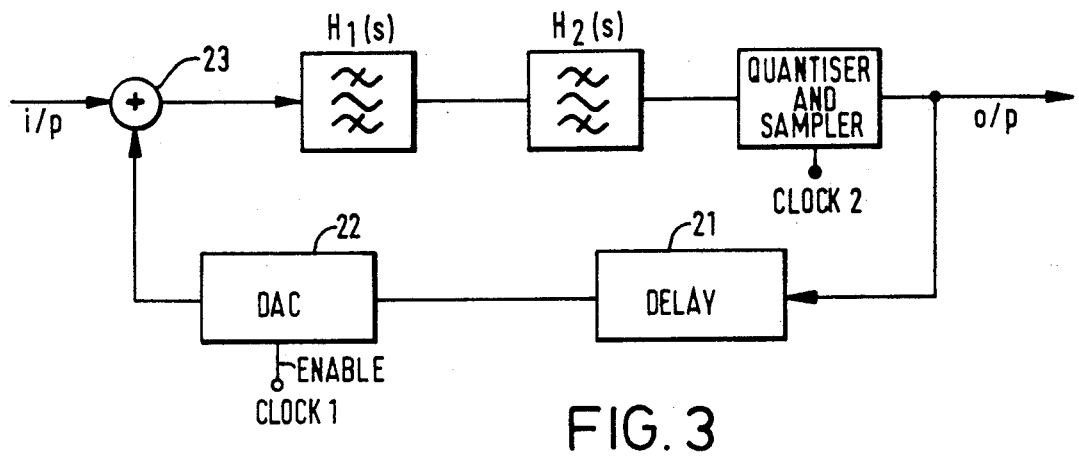
FIG. 3 is a block diagram of the architecture of a first converter.

Referring to FIG. 3, the first analogue-to-digital converter has an input i/p for analogue signals such as the i.f. of a radio receiver and the output o/p producing data in digitised form. The converter has analogue bandpass filter means in two stages H1(s) and H2(s). These are followed by a quantiser which converts the analogue signal into one of a number of discrete levels, the output of the quantiser being sampled at a sampling frequency of 10 MHz provided by clock 2, i.e. a sampling period of 100 ns.

Figure 1:
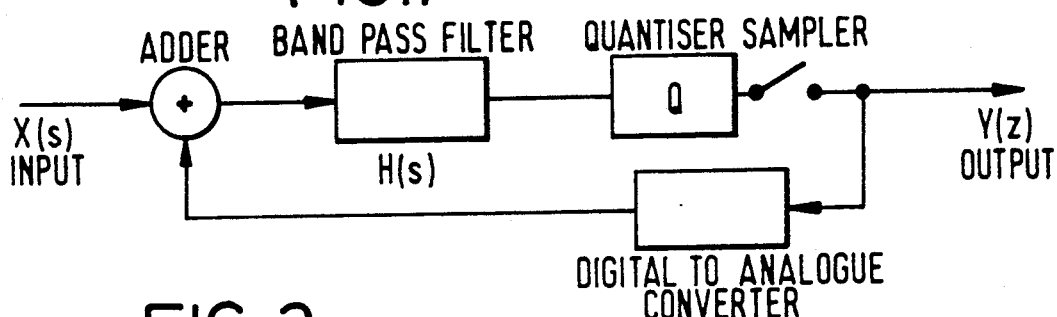
FIG. 1 is a block diagram of a·Sigma-Delta noise shaping A to D converter.
Figure 2:
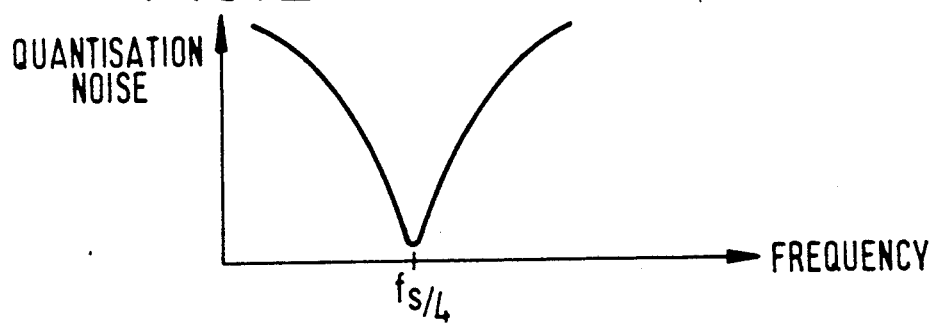
FIG. 2 is a plot of the quantisation noise vs. frequency for the converter of FIG. 1.

In accordance with the known Sigma-Delta design, the digitised data pulses are fed back to the input of the bandpass filter means by a main feedback loop, by a delay 21, a digital-to-analogue converter 22 and an adder 23. This produced a null in the quantisation noise of the form shown in FIG. 2, at the i.f. of 2.5 MHz.

As explained hereinbefore, when the inventor investigated such a circuit, the discovered that undesirable phase changes took place in the open loop condition and that instability was possible in a closed loop condition.

The i.f. signal consists of an I(in phase) and Q(quadrature) component. It was found that the digital output corresponding to the Q component was influenced by variations in the I component (and vice versa). Naturally, the coder should modulate the I and Q components in the analogue signal entirely independently.

Figure 2A:
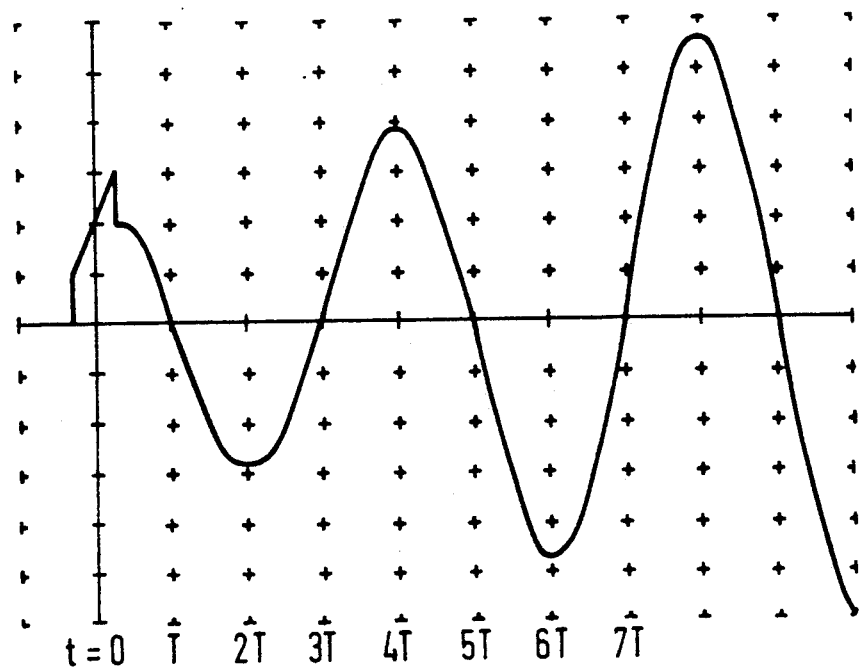
FIG. 2a is a plot of an ideal open-loop impulse response for the bandpass filter.

Referring to FIG. 2a, the open loop impulse response of the bandpass filter means of FIG. 3 is of the general form shown in the Figure. A necessary condition for independence in the modulation of the I and Q components is that the impulse response must be zero at the times $t=T$, $3T$, $5T$, etc., where T is the sampling period, (the time instants 0, 2T etc also being sampling instants). This could be looked at in another way by appreciating that the original impulse centred on $t=0$ contains only cosine components, and that the response of the filter must therefore contain only cosine terms and no sine terms. This would indeed be the case for a digitally implemented filter. A suitable digital response for a digital filer would be 2, 0, −3, 0, 4, 0, −5, 0 and so on. The instability referred to arises because the response of the bandpass filter means does not exactly pass through 0 at times $t=T$, $3T$, $5T$. This is not because of limitations inherent in the components. At the first bandpass filter Hl(s), the impulse is centred on $t=0$, and is balanced about $t=0$. However, the second bandpass filter H2(s) receives a signal consisting basically of a combination of a rectangular pulse, and a cosine pulse commencing at $t=0$. This time, the pulse received by the bandpass filter H2(s) is unbalanced about time $t=0$, and sine components are therefore generated by H2(s).

Figure 5:
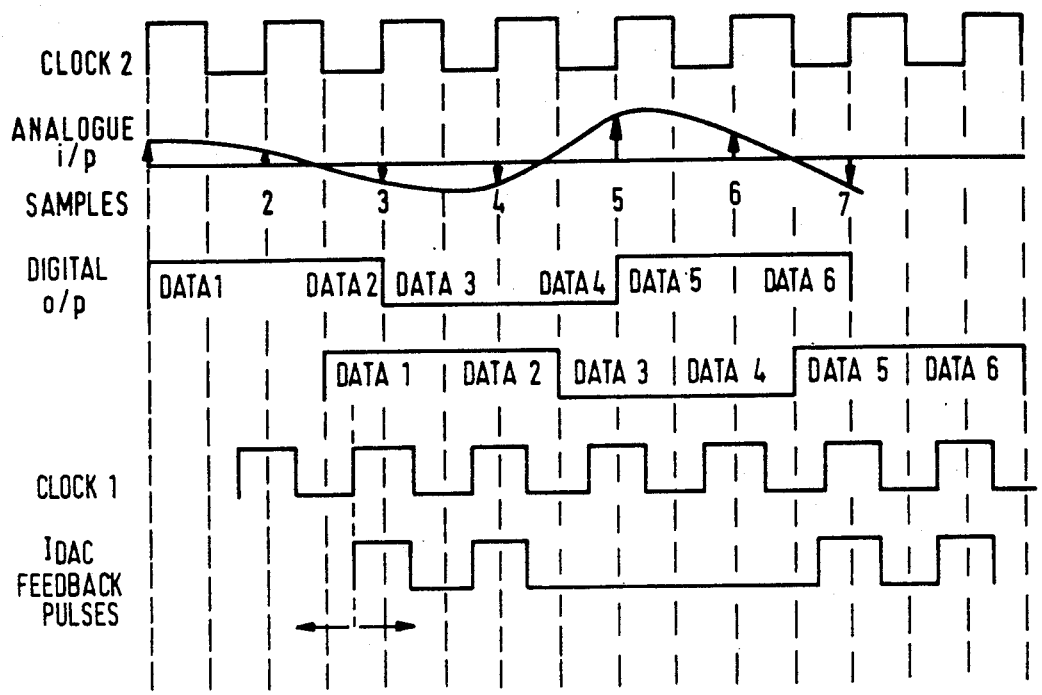
FIG. 5 is a timing diagram for the circuit of FIG. 4.
Figure 5A:
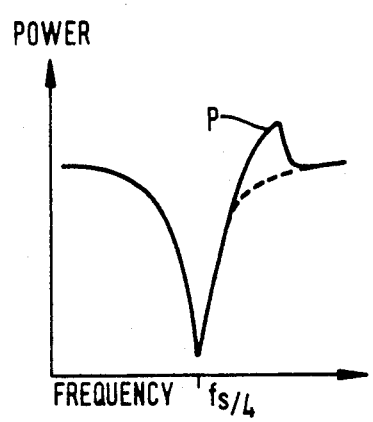
FIG. 5a shows an example of the power spectrum of the converters of FIGS. 3 and 4 when not correctly adjusted.

In accordance with the invention, means is provided for varying the phase between clocks 1 and 2. Referring to the circuit diagram of FIG. 3, the analogue input to the bandpass filters $H_1(s)$ and $H_2(s)$ is sampled by the quantiser producing a digital data output. This string of pulses is delayed by one and a half periods by the delay 21, clocked by a clock running in synchronism with clock 2. The data is fed to digital-to-analogue converter 22 which is enabled by clock 1, and produces feedback pulses. Adjustments are made to the relative phases of clocks 1 and 2 so that the feedback pulses (controlled by clock 1) are advanced or retarded relative to the data pulses and hence relative to the sampling instants (controlled by clock 2) until the zero crossings of the open loop impulse response shown in FIG. 2a coincide with the sampling instants. While the coincidence of the crossings cannot be measured or calculated directly, the need for any phase variation is indicated by examination of the spectra of the converter in the sense that non-coincidence of the zero crossings with the sampling instance will be manifested as unwanted peaks P in the spectra e.g. as shown in FIG. 5a. The phase relationship of the two clocks can then be varied to eliminate the unwanted peak. A full 360° of variation of phase relationship between clocks 1 and 2 is built into the system in order to cope with any possible phase adjustment necessary.

The effect of adjusting the phase relationship of the two clocks is to move the impulse response curve (by adjusting clock 1) or the grid of sampling instants (by adjusting clock 2). It follows that the peaks of the impulse response will not coincide with the sampling instants. However, because the gradient of the impulse response is much larger at the zero crossings than at the peaks, it is possible, by altering the relative phases of the impulse response and the sampling instants, to eliminate a large error at the zero crossings whilst introducing only a small error at the peaks.

The circuit is suitable for i.f. of 2.5 MHz, but the invention is applicable to other values of i.f. e.g. ⅛ or ⅜ of the sampling frequency of 10 MHz, or even ⅝ or other odd multiples of the sampling frequency e.g. 12.5, 17.5 MHz. Indeed, the circuit is suitable for other i.f.s and, while the i.f. may be one quarter of the sampling frequency, there is no restriction on the ratio between the i.f. and the sampling frequency, and the i.f. may be greater than the sampling fequency.

The quantiser may be a multi-bit quantiser e.g. two bits i.e. two positive and two negative values. Preferably, however, a one bit quantiser is used i.e. a positive or a negative value. The use of a one bit quantiser has the advantage that the quantisation will then be linear, and the digital-to-analogue converter then simply produces a pair of output levels of very consistent value in response to a digital input comprising two ranges of levels, one range designated as digital 0 and one range designated as digital 1. The bandpass filter means may be an inductor and a capacitor in parallel, together with a series resistive element.

A practical circuit for realising the architecture of FIG. 3 will now be described with reference to FIG. 4. The analogue input voltage is fed to an input buffer 24 having a high output impedance, the output signal being a current to allow the addition at summing node current adder 25. The loop filters H'(s), Hz(s) are implemented by inductors and capacitors, which may be similar elements such as crystal resonators, together with resistors, as shown. Buffer amplifier 26 converts the output voltage of the first filter to a current drive of the second filter. Buffer 27 provides a voltage input to a comparator 28 which has a positive and a negative output level depending on whether the input voltage is positive or negative at the sampling instants defined by the clock 2. Delay 29, clocked by clock 2, provides a one and a half period delay. Digital-to-analogue converter controller 30 connects the output of current generator 31 to contact 31a when data pulses are positive (see FIG. 5) so that feedback pulses are enabled by clock 1, and to contact 31b connected to earth when data pulses are a negative level. The phase relationship of clocks 1 and 2 is adjusted as described. Of course, once the adjustment has been made and suitable component values selected, subsequent converters can be made without the phase relationship being variable but simply at the particular phase relationship found to give best results reducing instability. Suitable values of components, including resitive $R_1$ and $R_2$, must be chosen to give an open loop response such that at the even sampling instants, 0, 2T, 4T etc, the response coincides with those of a digitally implemented filter i.e. 2, $-3$, 4, $-5$ etc.

As an alternative to varying the phase relationship of clocks 1 and 2, there may be a fixed relationship between the phases of the clocks 1 and 2, and the zero crossings may be brought into synchronism with the sampling instants by cancellation of any non-zero component by correction pulses.

Figure 6:
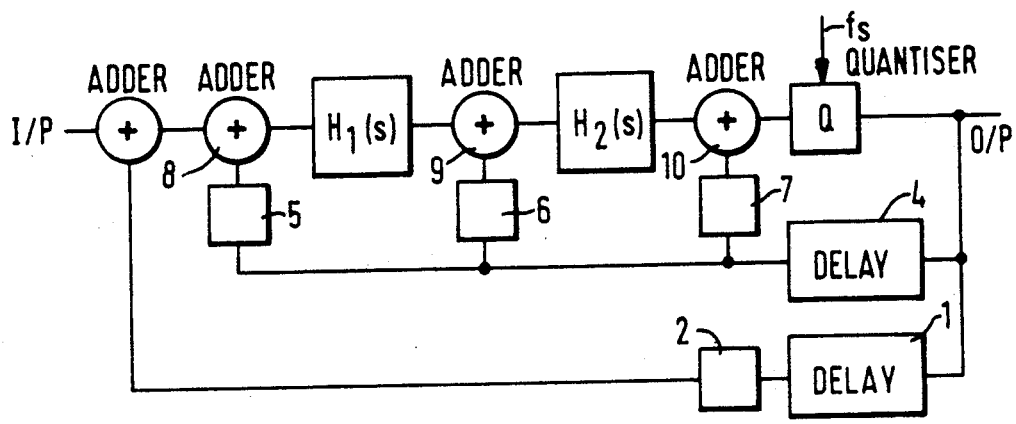
FIG. 6 is a block diagram of the architecture of a second form of converter.

Referring to FIG. 6, a correction feedback loop contains a delay 4 and digital-to-analogue converters 5 to 7 feeding adders 8 to 10. The main feedback data pulses travelling via the delay 1 are delayed one and a half periods in a fixed phase relationship relative to the data pulses at the output, and the correction data pulses are delayed by a further sample period. The level of the correction pulses are varied so that any non-zero component of the impulse response at the sampling instants is cancelled by an equal and opposite component.

Figure 7:
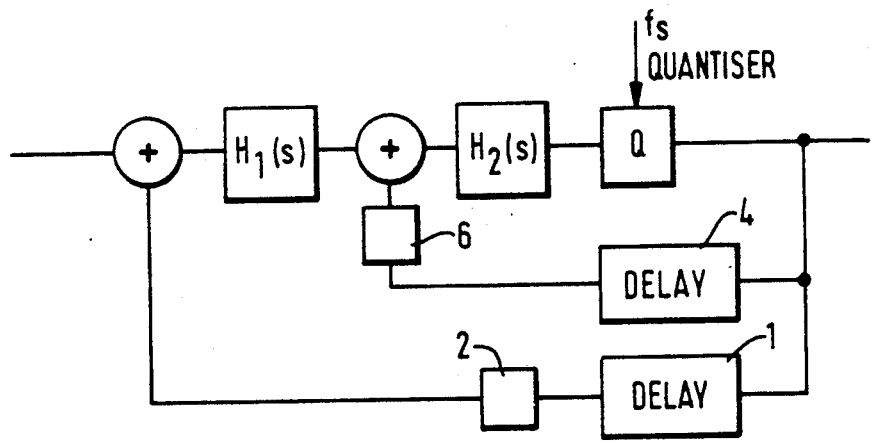
FIG. 7 is a block diagram of the second converter with simplified architecture.

It has been determined that performance very nearly the same as would be given by the architecture of FIG. 6 would be given by the architecture shown in FIG. 7. Here the corrective feedback loop is applied at the input of the second stage of the bandpass filter means only, although the level of the correction pulse may require to be different from that applied to the input of the second stage in the FIG. 6 architecture.

Figure 4:
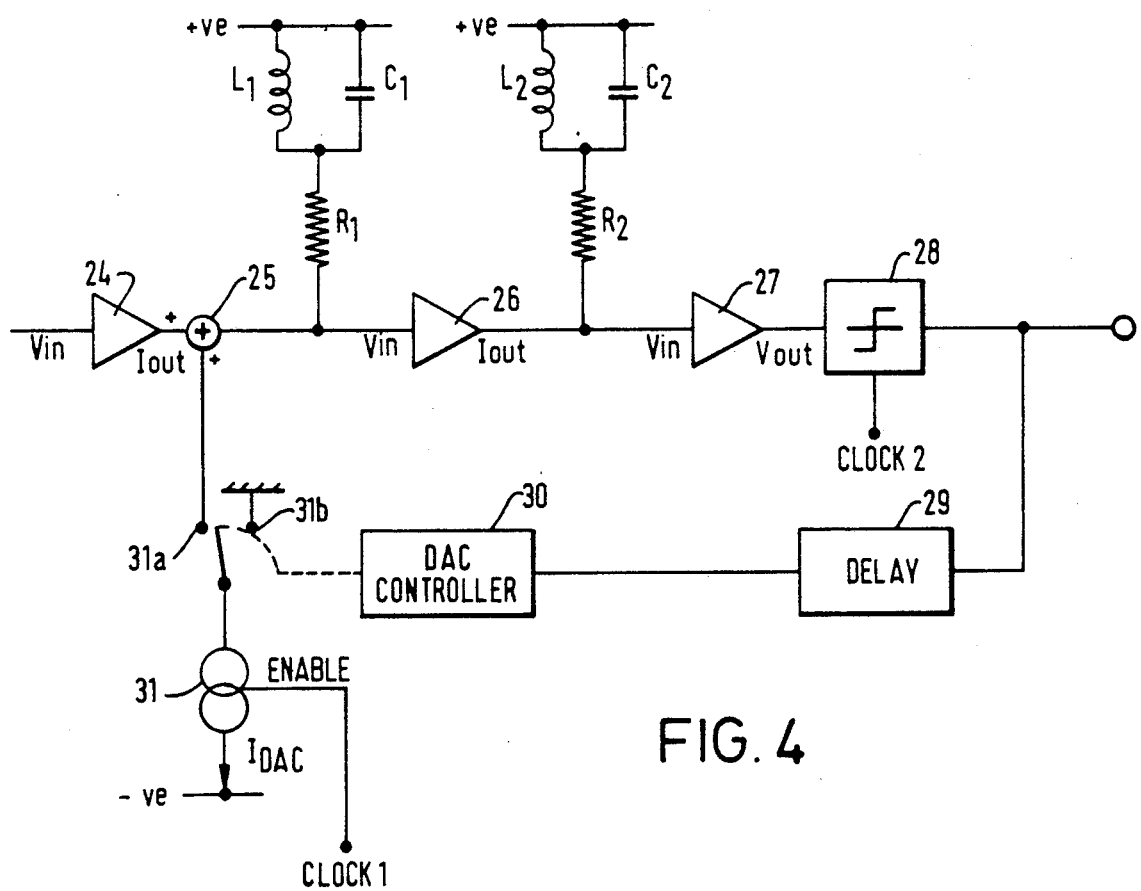
FIG. 4 is a circuit diagram of a practical realisation of the architecture shown in FIG. 3.
Figure 8:
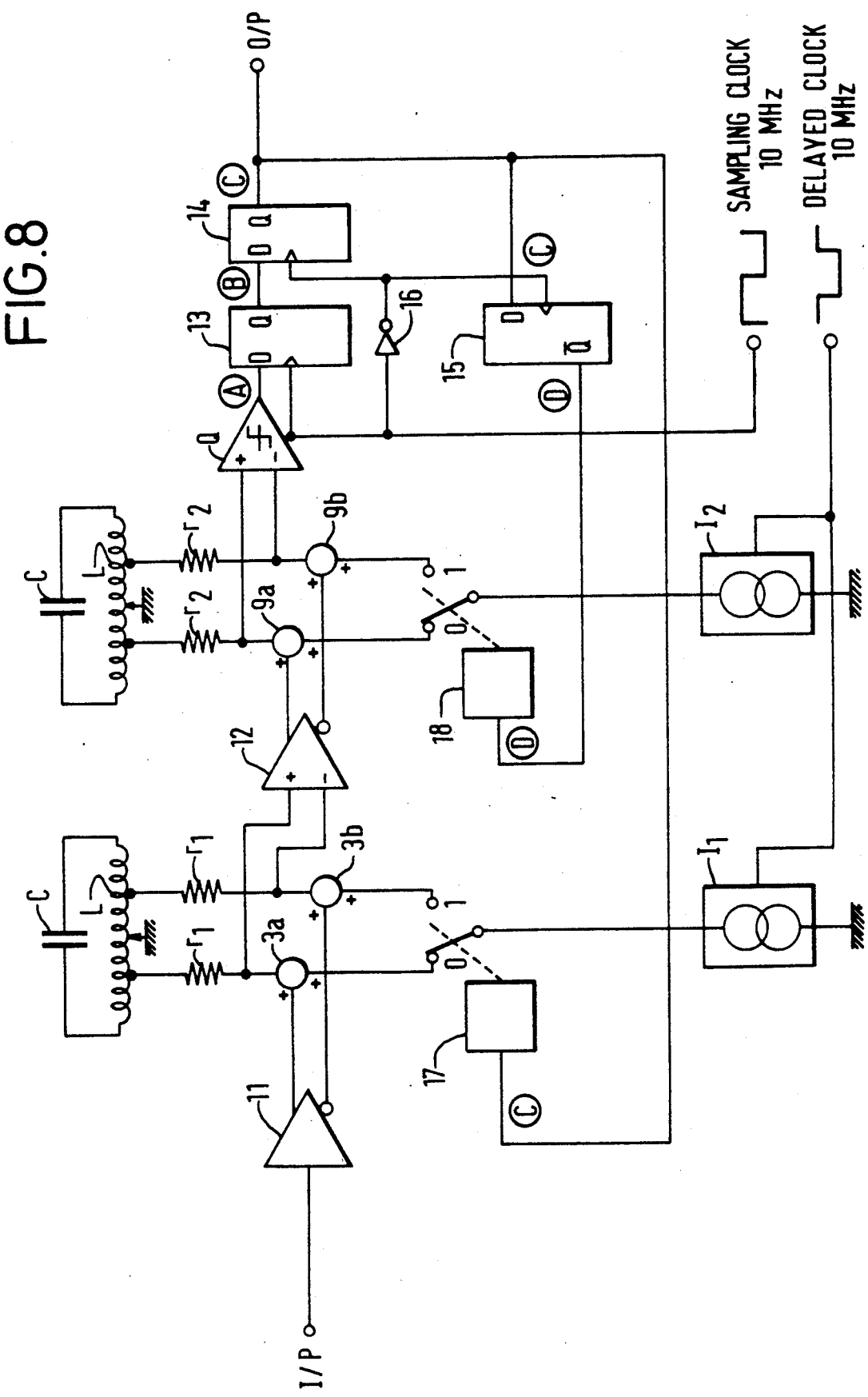
FIG. 8 is a circuit diagram of a practical realisation of the architecture shown in FIG. 7.

As with the embodiment of FIGS. 3 and 4, the bandpass filter may be realised by an inductor and capacitor in parallel, together with series resistors, the quantiser may be a multi-bit but preferably a single bit quantiser, and the null in quantisation noise may be at one quarter of the sampling frequency of 10 MHz. A practical realisation of the architecture of FIG. 7 is now described with respect to FIG. 8, with balanced inputs (for that matter, the inputs in FIG. 3 and 4 could be balanced if desired).

The input of the loop filters is a current signal and the output is a voltage signal. The main feedback pulse and the correction pulses are provided by current generators $I_1$ and $I_2$ controlled by the data output of the converter. Consequently, current adders may be employed. Because balanced inputs are employed, the same current source is used for positive and negative main and correction pulses. Unbalanced filters could be used if desired by either pulsing the correction DAC ($I_1$ or $I_2$) or not. In addition, in the case where the quantiser Q is multi-bit, the pulse level of $I_1$ or $I_2$ will need to be scaled to the appropriate output bit level.

The converter achieves high resolution within the passband of the loop filters by the use of over-sampling (of the sampling frequency relative to the bandwidth) and feedback. The sampling rate is four times the centre frequency of the passband. The loop filters are tuned at or close to the centre frequency.

The input signal is fed to an input buffer 11 having a non-inverting output and an inverting output. The output impedance is very high, and the output signals are current rather than voltage signals to allow addition in the current adders 3a, 3b.

The loop filters Hl(s) and H2(s) each have an inductor (L) in parallel with a capacitor (C), the inductors being tapped and fed with current via pairs of resistors $r_1$, $r_2$, respectively, the values being chosen so that, with the correction pulses, the open loop response of the bandpass filter means coincides with that of an ideal digital filter e.g. 2, $-3$, 4, $-5$ ... at the even sampling instants. The output of the first stage is a voltage fed to a mid-stage buffer amplifier 12 with a high input and output impedance which serves to isolate the two loop filters from each other. The output of the buffer amplifier forms a current drive to adders 9a, 9b at the input of the second loop filter.

The output of the second loop filter is connected to a sampled quantiser formed by a comparator with a low delay and low hysteresis, which acts as a one-bit analogue-to-digital converter, i.e. two voltage levels.

The comparator output changes to the appropriate positive or negative voltage every rising clock pulse edge. D-type flip-flops 13, 14, 15, one of which is controlled via inverter 16, control switches 17, 18 so that the main feedback data pulse for the current generator $I_1$ is delayed by one and a half periods (C) and the correction data pulse from current generator $I_2$ is delayed by two and a half periods (D), relative to an output pulse (A) from the comparator. The flip-flops 13, 15 transfer the input voltage from the D to the Q terminal on each rising clock edge, providing a one pulse period delay or, in the case of flip-flop 14, a half period delay because the falling edge has been inverted to become a rising edge.

The relation between a data output pulse at the output of the comparator and the corresponding main and correction feedback data pulses can be seen in FIG. 9. Because the current generators $I_1$, $I_2$ are fed by a delayed clock, the current pulses (E) and (F) are half the sampling period long i.e. 50 nanoseconds and fall well within the period for which the data pulses are valid. Alternate sampling instants have been indicated as I and Q since the i.f. signal can be regarded as complex and having in-phase and quadrature components. While current generator $I_2$ may be varied by trial and error to achieve cancellation of any residual component of the impulse response at the sampling instants, the necessary setting may instead be calculated if desired.

It has been found that good results can be obtained by the following values:

$r_1 = 183$ ohms, $r_2 = 27.6$ ohms, C = 154 pF, L = 34.2 uH (with tappings at the quarter, half and three quarter points), $I_1 = 2.7$ mA, $I_2 = 1.0$ mA, and the differential voltage across the mid-stage buffer amplifier 12 being $731 \times$ the current in the inverting and non-inverting outputs, which are equal in value and opposite in sign.

Of course, various modifications may be made without departing from the scope of the invention. Thus, in all embodiments, the main feedback pulses could be delayed by another even number of periods instead of 2, e.g. 4, 6 and the correction pulses (in FIGS. 6 and 7) could be delayed by another odd number of periods instead of 3. The filters could employ series inductance and capacitance instead of parallel inductance and capacitance, and in this case resistors in parallel with the inductor and capacitor in series may be used. Equally, other high-Q filters could be used in all embodiments.

I claim:

1. Analogue-to-digital converter comprising bandpass filter means for filtering a signal derived from an analogue input signal, digitising means for producing, at sampling instants, samples at one of a discrete number of values corresponding to a signal derived from the output of the bandpass filter means, a feedback loop feeding a signal derived from the output of the digitising means to the bandpass filter means, the circuit being arranged to produce a minimum in quantisation noise in the passband of the filter means, in which there is provided means for producing a phase offset between the fedback pulses and the sampling instants of the digitising means to produce a desired response of the bandpass filter means at the sampling instants to a single fedback pulse.

2. Analogue-to-digital converter as claimed in claim 1, in which the feedback pulses are delayed by an even number of sampling periods compared to the samples at the output of the digitising means.

3. Analogue-to-digital converter as claimed in claim 1, in which the digitising means produces samples at one of two values.

4. Analogue-to-digital converter as claimed in claim 3, in which the digitising means is a comparator, the output of which is either a positive signal or a negative signal depending on whether the input is above or below a threshold.

5. Analogue-to-digital converter as claimed in claim 1, in which the converter forms a Sigma-Delta modulator.

6. Analogue-to-digital converter as claimed in claim 1, in which the bandpass filter means comprise a first stage bandpass filter and a second stage bandpass filter.

7. Analogue-to-digital converter as claimed in claim 1, in which the bandpass filter means includes an inductor and capacitor in parallel with series resistor, or an inductor and capacitor in series, and together in parallel with a resistor.

8. Analogue-to-digital converter as claimed in claim 1, in which the input to the bandpass filter means is a current source and the output is a voltage.

9. Analogue-to-digital converter as claimed in claim 1, including an input buffer for converting input analogue signals to a pair of signals, one of which is inverted compared to the other.

10. Analogue-to-digital converter as claimed in claim 9, in which the feedback loop includes a signal generator for generating a signal corresponding to a signal at the output of the digitising means, and the signal can be combined with either the non-inverting or inverting signal from the buffer.

11. Analogue-to-digital converter as claimed in claim 10, in which the feedback loop includes a delay.

12. The converter according to claim 1, wherein at least some of the zero crossings of the response of the bandpass filter means to a single feedback pulse are made to coincide with the sampling instants.

13. Analogue-to-digital converter comprising bandpass filter means for filtering a signal derived from an analogue input signal, digitising means for producing, at sampling instants, samples at one of a discrete number of values corresponding to a signal derived from the output of the bandpass filter means, a feedback loop feeding a signal derived from the output of the digitising means to the bandpass filter means, the circuit being arranged to produce a minimum in quantisation noise in the passband of the filter means, in which there is provided an additional corrective feedback loop for feeding correction pulses delayed with respect to and derived from the output of the digitising means to the bandpass filter means in order to produce a desired response of the bandpass filter means at the sampling instants to a single fedback pulse.

14. Analogue-to-digital converter as claimed in claim 13, in which the feedback pulses are delayed by an odd number of sampling periods compared to the feedback at pulses.

15. Analogue-to-digital converter as claimed in claim 13, in which the feedback pulses are delayed by an even number of sampling periods compared to the samples at the output of the digitising means.

16. Analogue-to-digital converter as claimed in claim 13, in which the digitising means produces samples at one of two values.

17. Analogue-to-digital converter as claimed in claim 16, in which the digitising means is a comparator, the output of which is either a positive signal or a negative signal depending on whether the input is above or below a threshold.

18. Analogue-to-digital converter as claimed in claim 13, in which the converter forms a Sigma-Delta modulator.

19. Analogue-to-digital converter as claimed in claim 13, in which the bandpass filter means comprise a first stage bandpass filter and a second stage bandpass filter.

20. Analogue-to-digital converter as claimed in claim 19, in which the corrective loop feeds a signal derived from the output of the digitising means to the input of the second stage bandpass filter.

21. Analogue-to-digital converter as claimed in claim 13, in which the bandpass filter means includes an inductor and capacitor in parallel with series resistor, or an inductor and capacitor in series, and together in parallel with a resistor.

22. Analogue-to-digital converter as claimed in claim 13, in which the input to the bandpass filter means is a current source and the output is a voltage.

23. Analogue-to-digital converter as claimed in claim 13, including an input buffer for converting input analogue signals to a pair of signals, one of which is inverted compared to the other.

24. Analogue-to-digital converter as claimed in claim 23, in which the feedback loop includes a signal generator for generating a signal corresponding to a signal at the output of the digitising means, and the signal can be combined with either the non-inverting or inverting signal from the buffer.

25. Analogue-to-digital converter as claimed in claim 13, in which the feedback loop includes a delay.

26. The converter according to claim 13, wherein at least some of the zero crossings of the response of the bandpass filter means to a single feedback pulse are made to coincide with the samplign instants.

* * * * *